US011392368B2

(12) United States Patent
Yamada et al.

(10) Patent No.: US 11,392,368 B2
(45) Date of Patent: Jul. 19, 2022

(54) ELECTRONIC CONTROL SYSTEM FOR UPDATING CIRCUIT

(71) Applicant: HITACHI AUTOMOTIVE SYSTEMS, LTD., Hitachinaka (JP)

(72) Inventors: Tetsuya Yamada, Tokyo (JP); Tomohito Ebina, Tokyo (JP); Kazuyoshi Serizawa, Tokyo (JP); Hiromichi Ito, Tokyo (JP); Hidetoshi Teraoka, Tokyo (JP); Kohei Sakurai, Tokyo (JP)

(73) Assignee: HITACHI ASTEMO, LTD., Hitachinaka (JP)

(*) Notice: Subject to any disclaimer, the term of this patent is extended or adjusted under 35 U.S.C. 154(b) by 0 days.

(21) Appl. No.: 16/628,247

(22) PCT Filed: Jun. 25, 2018

(86) PCT No.: PCT/JP2018/023947
§ 371 (c)(1),
(2) Date: Jan. 2, 2020

(87) PCT Pub. No.: WO2019/009115
PCT Pub. Date: Jan. 10, 2019

(65) Prior Publication Data
US 2020/0174783 A1 Jun. 4, 2020

(30) Foreign Application Priority Data
Jul. 4, 2017 (JP) .............................. JP2017-130816

(51) Int. Cl.
*G06F 9/44* (2018.01)
*G06F 8/658* (2018.01)
*B60R 16/02* (2006.01)

(52) U.S. Cl.
CPC .............. *G06F 8/658* (2018.02); *B60R 16/02* (2013.01)

(58) Field of Classification Search
CPC ................................. G06F 8/658; B60R 16/02
See application file for complete search history.

(56) References Cited

U.S. PATENT DOCUMENTS

| 6,021,186 A | 2/2000 | Suzuki et al. |
| 2003/0005292 A1* | 1/2003 | Matthews, Jr. ......... G06F 21/76 713/160 |

(Continued)

FOREIGN PATENT DOCUMENTS

| JP | 2000-138288 A | 5/2000 |
| JP | 2007-080034 A | 3/2007 |

(Continued)

OTHER PUBLICATIONS

International Search Report with English translation and Written Opinion issued in corresponding application No. PCT/JP2018/023947 dated Aug. 21, 2018.

(Continued)

*Primary Examiner* — Hang Pan
(74) *Attorney, Agent, or Firm* — Foley & Lardner LLP

(57) ABSTRACT

The present invention makes it possible to reduce the volume of communication data necessary for updating the configuration of a circuit unit of a reconfigurable circuit device. In an vehicle control system 10 including an FPGA 3, the FPGA 3 includes a circuit unit including a reconfigurable circuit and a circuit SRAM that stores configuration information of the circuit unit. A transfer check unit that acquires a difference command regarding a change part of a circuit element in the circuit unit, and a data conversion unit 4 that updates the configuration information based on the difference command are provided. Further, in the vehicle control system 10, a non-volatile memory 6 that stores the (Continued)

configuration information to be stored in the circuit SRAM is further provided. The data conversion unit 4 may update the configuration information stored in the non-volatile memory 6 based on the difference command acquired by the transfer check unit.

6 Claims, 8 Drawing Sheets

(56) References Cited

U.S. PATENT DOCUMENTS

| | | | |
|---|---|---|---|
| 2004/0054995 A1* | 3/2004 | Lee | G06F 8/65 717/173 |
| 2009/0327987 A1 | 12/2009 | Teig et al. | |
| 2010/0023736 A1 | 1/2010 | Morimoto et al. | |
| 2010/0050168 A1* | 2/2010 | Sharonov | E21B 47/12 717/173 |
| 2010/0064024 A1* | 3/2010 | Horr | H04N 21/4586 709/217 |
| 2012/0102477 A1* | 4/2012 | Kim | G06F 8/654 717/169 |
| 2013/0185548 A1* | 7/2013 | Djabarov | G06F 21/57 713/2 |
| 2015/0149974 A1 | 5/2015 | Nonomura | |
| 2015/0373225 A1* | 12/2015 | Tanaka | H04N 1/32609 358/474 |
| 2016/0162193 A1 | 6/2016 | Tanaka | |

FOREIGN PATENT DOCUMENTS

| | | |
|---|---|---|
| JP | 2014-138382 A | 7/2014 |
| JP | 2015-106594 A | 6/2015 |
| JP | 2016-009339 A | 1/2016 |
| JP | 2016-111629 A | 6/2016 |

OTHER PUBLICATIONS

Extended European Search Report issued in corresponding European Application No. 18827713.1 dated Dec. 10, 2020.

* cited by examiner (a) UPDATE IN WHICH MODULE BOUNDARY IS NOT CHANGED BY DIFFERENCE COMMAND (b) UPDATE IN WHICH MODULE BOUNDARY IS CHANGED BY DIFFERENCE COMMAND

ELECTRONIC CONTROL SYSTEM FOR UPDATING CIRCUIT

TECHNICAL FIELD

The present invention relates to an electronic control system including a reconfigurable circuit device such as a field programmable gate array (FPGA).

BACKGROUND ART

Software updates of a microcomputer are performed using OTA (Over-the-air) in response to function changes or function additions to an electronic control unit (ECU) in an electronic control system mounted on a vehicle.

In the ECU that controls a camera and the like mounted on the vehicle, installation of a reconfigurable circuit device such as an FPGA has been widely spread. In order to handle correction of a logic defect in the FPGA, function changes, function additions, and the like after shipment, it is considered that the logic of the FPGA is changed by OTA, similar to the software update of the microcomputer.

In a case where the logic of the FPGA is changed by OTA, the updated logic (update logic) is transmitted from a data center to the vehicle by wireless communication, similar to the software update of the microcomputer. If the volume of data transmitted by wireless communication is large, communication cost and communication time are required. Therefore, it is required to reduce the volume of data to be transmitted.

For example, in a case where the logic of the FPGA is changed by OTA, if all pieces of configuration data are updated, the volume of communication data increases. Thus, a partial reconfiguration function called as partial reconfiguration is known as a method of transmitting some pieces of configuration data. Partial reconfiguration can change only the logic in a preset area, which is called as a module. Thus, the logic of the FPGA can be changed by transmitting configuration data in units of modules without transmitting all pieces of configuration data. However, according to the partial reconfiguration, there are limits in that the logic is changed in units of modules, and it is not possible to change an interface between the modules.

Here, the partial reconfiguration will be briefly described. In the partial reconfiguration, a module A1 in an FPGA can be replaced with a module A2 having the same interface and a different function. Since the module A1 and the module A2 have the same interface, the module A2, and the other modules B1 and C1 connected to the module A1 are connected by simply replacing the module A1 with the module A2. For example, PTL 1 discloses an example in which a plurality of configuration ROMs are prepared, and the function of the FPGA is switched by partial reconfiguration using partial reconfiguration.

As a technology related to FPGA logic update, PTL 2 discloses a technology in which, in order to enable failure diagnosis in a case where a circuit is configured even in a part which has not been used before an update, a diagnostic program is supplied to an electronic control device along with FPGA update data.

CITATION LIST

Patent Literature

PTL 1: JP 2016-9339 A
PTL 2: JP 2015-106594 A

SUMMARY OF INVENTION

Technical Problem

As described above, since communication cost is required if the volume of data to be transmitted is large, it is required to further reduce the volume of data to be transmitted.

On the other hand, the technique disclosed in PTL 1 is partial reconfiguration by partial reconfiguration, and even if the update target module includes the same logic before and after the update, the entirety of the circuit in the module is updated. Therefore, it is necessary to transmit data in units of modules. In addition, partial reconfiguration by partial reconfiguration is based on the premise that the bit width and module boundaries between modules do not change. Thus, there is a problem that it is not possible to flexibly handle correction of logic defects with changing the bit width and the module boundaries between modules, function addition, function changes, and the like.

In a vehicle, a driver can turn off an ignition switch at any time, or there is a possibility that the electric power stored in a battery of the vehicle is exhausted. Thus, the supply of power to the electronic control device may be cut off at any time. Therefore, in a case where the logic of the FPGA in the electronic control device mounted on the vehicle is updated, it is necessary that the logic of the FPGA is not destroyed even if the power is cut off during the update, or the update of the logic of the FPGA is successfully performed after the power is cut off.

The present invention has been made in view of the above circumstances, and an object of the present invention is to provide a technology capable of appropriately reducing the volume of communication data necessary for updating configuration information of a reconfigurable circuit device.

Solution to Problem

To achieve the above object, according to an aspect, an electronic control system includes a reconfigurable circuit device, an acquisition unit that acquires difference information regarding a change part of a circuit element in the circuit unit, and a data conversion unit that updates the configuration information based on the difference information. The reconfigurable circuit device includes a circuit unit including a reconfigurable circuit and a setting storage unit that stores configuration information of the circuit unit.

ADVANTAGEOUS EFFECTS OF INVENTION

According to the present invention, it is possible to appropriately reduce the volume of communication data necessary for updating configuration information of a reconfigurable circuit device.

DESCRIPTION OF EMBODIMENTS

Several embodiments will be described with reference to the drawings. The embodiments described below do not limit the invention according to the claims, and all the elements and combinations described in the embodiments are not necessarily essential for the solution of the invention.

First, a vehicle management system according to a first embodiment will be described.

Figure 1:
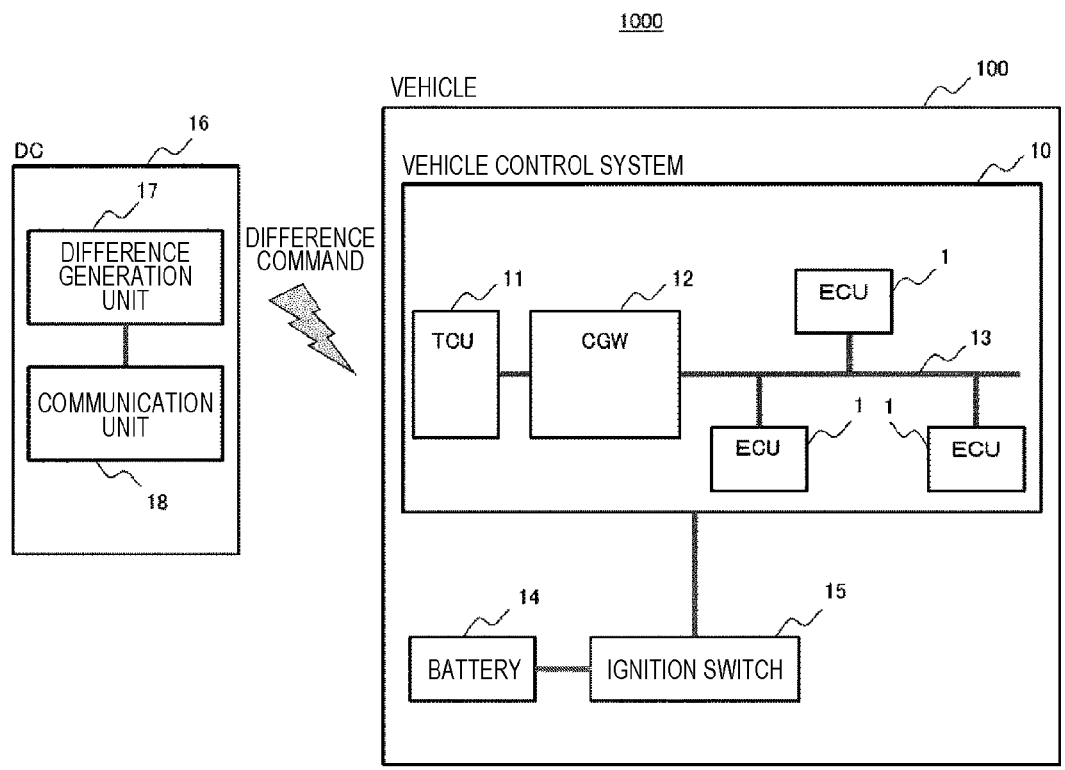
FIG. 1 is an overall configuration diagram of a vehicle management system according to a first embodiment.

FIG. 1 is an overall configuration diagram of the vehicle management system according to the first embodiment.

The vehicle management system 1000 includes a data center (DC) 16 and one or more vehicles 100.

The vehicle 100 includes a vehicle control system 10 as an example of an electronic control system, a battery 14, and an ignition switch 15. The battery 14 accumulates electric power and supplies electric power for operating each component of the vehicle control system 10. The ignition switch 15 receives an operation by a driver of the vehicle 100 to perform switching between power supply from the battery 14 to the vehicle control system 10 and power cutoff.

The vehicle control system 10 includes a telematics communication unit (TCU) 11 as an example of an acquisition unit, a central gateway (CGW) 12, and one or more electronic control units (ECUs) 1. The CGW 12 and the ECU 1 are connected via a network 13 such as a controller area network (CAN) or the Ethernet (registered trademark), for example.

The TCU 11 receives a difference command distributed from the data center 16 by OTA (for example, radio) and transmits the difference command to the CGW 12. The CGW 12 performs decryption, authentication processing, and the like on the difference command received from the TCU 11. The CGW 12 performs error correction using an error correction code transmitted along with the difference command to check whether or not the difference command has been received correctly. The CGW 12 specifies an ECU 1, as an update target, to which the difference command is applied, based on a transmission content from the data center 16. In a case where it is checked that difference command has been correctly received, the CGW 12 transmits the difference command to the ECU 1 via the network 13. The ECU 1 performs various controls in the vehicle 100. The ECU 1 performs processing of updating a circuit configuration of a circuit unit in a field programmable gate array (FPGA) 3 described later, based on the difference command. Details of the ECU 1 will be described later.

The data center 16 includes a difference generation unit 17 and a communication unit 18. The difference generation unit 17 generates a difference command for updating a difference between circuit configuration information (old configuration data) before updating the FPGA 3 of a predetermined ECU 1 in the vehicle 100 and circuit configuration information (new configuration data) after updating the FPGA. The communication unit 18 transmits the difference command to the vehicle 100 (update target vehicle) in which the ECU 1 including the FPGA 3 as the update target is mounted, in radio. In the embodiment, since the difference command is transmitted by OTA, it is possible to reduce the volume of transmission data, to reduce communication cost, and to reduce communication time.

Figure 2:
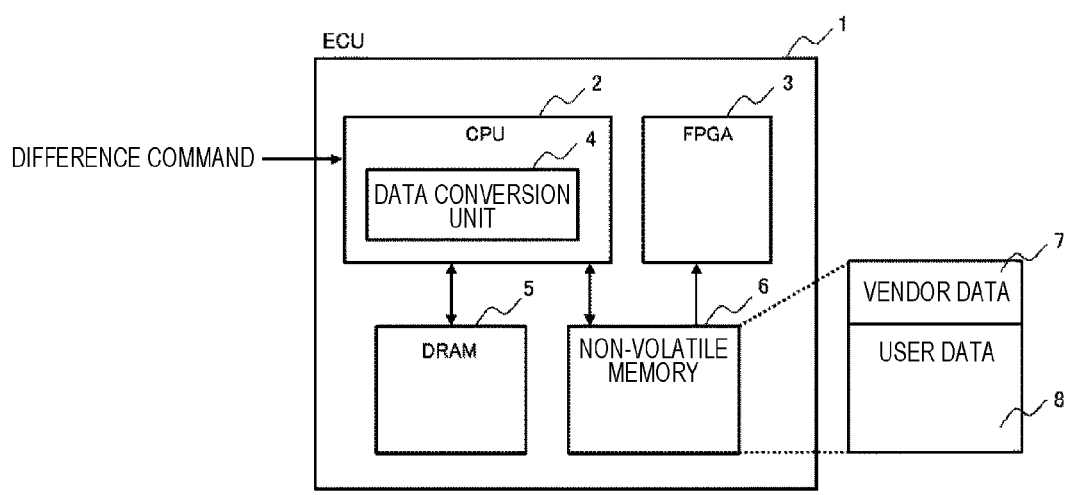
FIG. 2 is a configuration diagram of an ECU as an update target according to the first embodiment.

FIG. 2 is a configuration diagram of an ECU as an update target according to the first embodiment.

The ECU 1 includes a central processing unit (CPU) 2 as an example of a processor, an FPGA 3 as an example of a reconfigurable circuit device, a dynamic RAM (DRAM) 5, and a non-volatile memory 6 as an example of a non-volatile storage unit.

The CPU 2 executes various types of processing. For example, the CPU 2 executes various types of processing based on images from a camera (not illustrated) mounted on the vehicle 100. The CPU 2 executes processing for reconfiguring the FPGA 3 with new configuration data. The CPU 2 includes a data conversion unit 4. The data conversion unit 4 generates new configuration data by converting (updating) the old configuration data based on the difference command.

The DRAM 5 stores programs executed by the CPU 2 and various types of information used by the CPU 2.

The non-volatile memory 6 is a memory, such as a flash memory, capable of storing data for a long period even in a case where electric power is not supplied from the battery 14, and stores circuit configuration information (configuration data) for configuring the circuit of the FPGA 3. In the embodiment, the configuration data includes, for example, data (vendor data) 7 provided by a vendor of FPGA 3 and user data 8 provided by a user who constructs the FPGA 3 in order to expand the functions of FPGA 3. In the embodiment, the vendor data 7 is data which is relatively reliable and basically not updated. The circuit of the FPGA 3 is configured by only the vendor data 7 such that the FPGA 3 can be in a state (secure state) of not performing an abnormal operation. The user data 8 is data which is less reliable than the vendor data, and is updated when a defect is solved, a function is added, a function is changed, or the like.

Next, an example of logic update by a difference command will be described.

Figure 3:
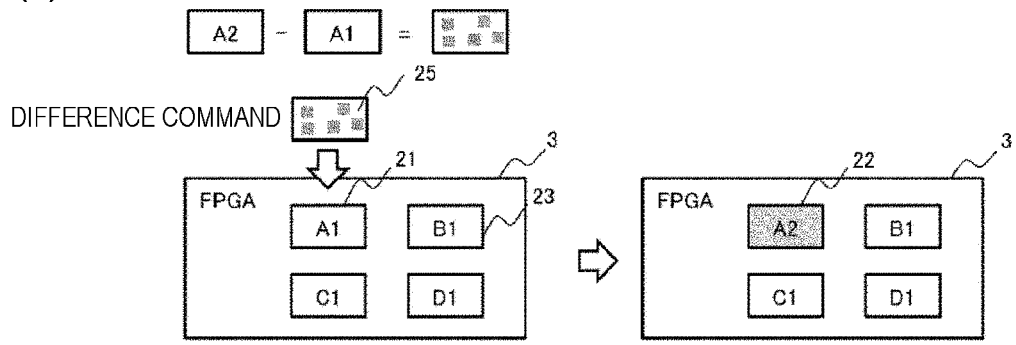
FIG. 3 is a diagram illustrating an update of a logic by a difference command according to the first embodiment.
Figure 3:
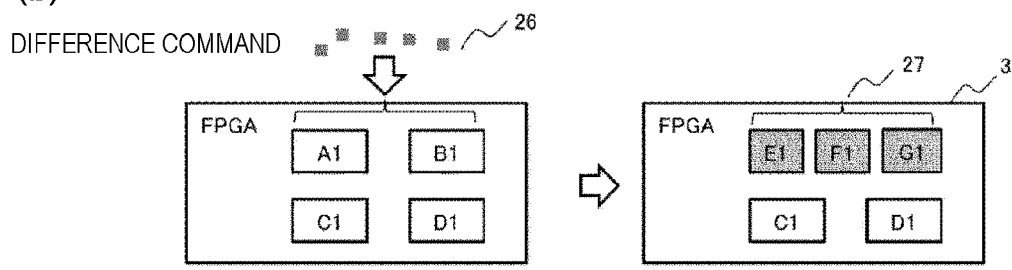

FIG. 3 is a diagram illustrating an update of a logic by a difference command according to the first embodiment.

FIG. 3(a) illustrates an example of an update in a case where a preset boundary between modules in the circuit of the FPGA 3 is not changed. FIG. 3(b) illustrates an example of an update in a case where the preset boundary between modules in the circuit of the FPGA 3 is changed.

In the embodiment, for example, in a case where a module A1 is updated to a module A2, as illustrated in FIG. 3(a), a difference command 25 corresponding to a difference between the module A2 and the module A1 is transmitted, and thereby the module A1 is converted to the module A2. In this case, not all pieces of configuration information of the module A2, but only the difference command 25 may be transmitted. Thus, it is possible to reduce the volume of data to be transferred.

In the embodiment, in a case where the modules A1 and B1 are updated to modules E1, F1, and G1, as illustrated in FIG. 3(b), a difference command 26 corresponding a difference of the modules E1, F1, and G1 from the modules A1 and B1 is transmitted, and thereby the modules A1 and B1 are converted into the modules E1, F1, and G1. In this case, not all pieces of configuration information of the modules E1, F1, and G1, but only the difference command 26 may be transmitted. Thus, it is possible to reduce the volume of data to be transferred.

In addition, it is possible to perform an update that changes the boundary of the module instead of the update in units of modules.

Next, an example of the difference command will be described.

Figure 4:
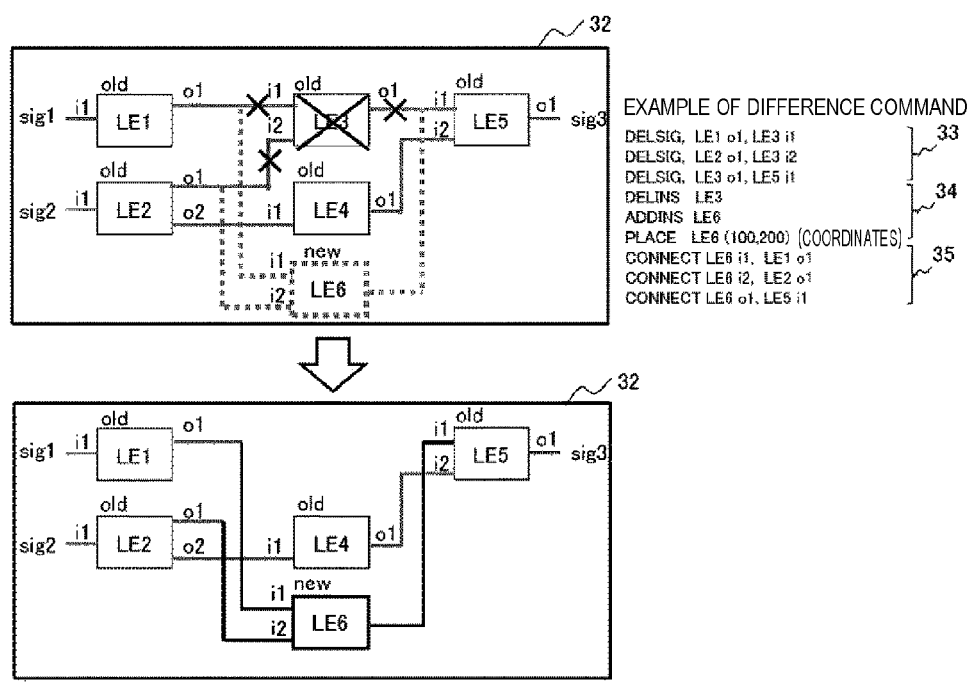
FIG. 4 is a diagram illustrating the difference command for changing a logic connection according to the first embodiment.

FIG. 4 is a diagram illustrating a difference command for changing a logic connection according to the first embodiment.

FIG. 4 illustrates a case where, in a module 32 including five logic elements LE1 to LE5, the logic element LE3 is deleted, a new logic element LE6 is added, and the connection to the logic element LE3 is switched to the connection to the logic element LE6.

As a difference command in a case of switching the connection as described above, the difference command has a command part 33, a command part 34, and a command part 35. The command part 33 is provided for deleting the connection of the logic elements LE1, LE2 to the logic element LE3, and the connection between the logic element LE3 and the logic element LE5. The command part 34 is provided for deleting the logic element LE3 and activating an instance of the logic element LE6. The command part 35 is provided for connecting the logic elements LE1 and LE2 to the logic element LE6 and connecting the logic element LE6 and the logic element LE5. The difference command depends on the element to be changed and does not depend on the number of logic elements in the module 32. Therefore, even in a case where there are several thousand logic elements LE in the module 32, the difference command is only for the elements to be changed. Thus, it is possible to reduce the data volume of the difference command more than the configuration information for the entirety of the module 32, and to reduce the volume of data to be used for communication.

Next, the FPGA will be described.

Figure 5:
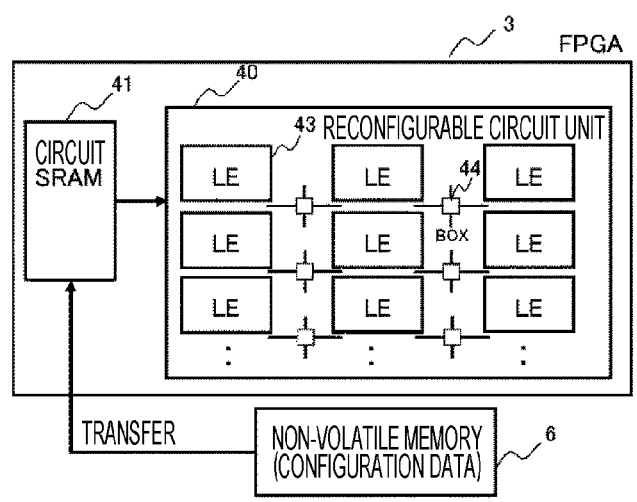
FIG. 5 is a configuration diagram of an FPGA according to the first embodiment.

FIG. 5 is a configuration diagram of the FPGA according to the first embodiment.

The FPGA 3 includes a circuit unit 40 and a circuit SRAM 41 as an example of a setting storage unit.

The circuit unit 40 is a reconfigurable circuit, and includes a plurality of logic elements (LE) 43 and a plurality of switch boxes 44 capable of switching connections between the logic elements 43, as circuit elements.

The circuit SRAM 41 stores configuration information (configuration data) for each circuit element of the circuit unit 40. Setting for each circuit element of the circuit unit 40 is performed with the configuration data stored in the circuit SRAM 41, and the logic of the circuit unit 40 is determined. For example, the configuration data is read from the non-volatile memory 6 when the FPGA 3 is activated, and is stored in the circuit SRAM 41.

Depending on the configuration data of the circuit SRAM 41, (1) setting of a lookup table of the logic element 43, (2) setting of a connection network of the switch box 44 to which the logic element 43 is connected, (3) setting of a connection network of a special cell such as a multiplier (not illustrated), (4) setting of data to a block RAM (SRAM) (not illustrated), (5) setting of a clock network setting, and the like are performed.

Figure 6:
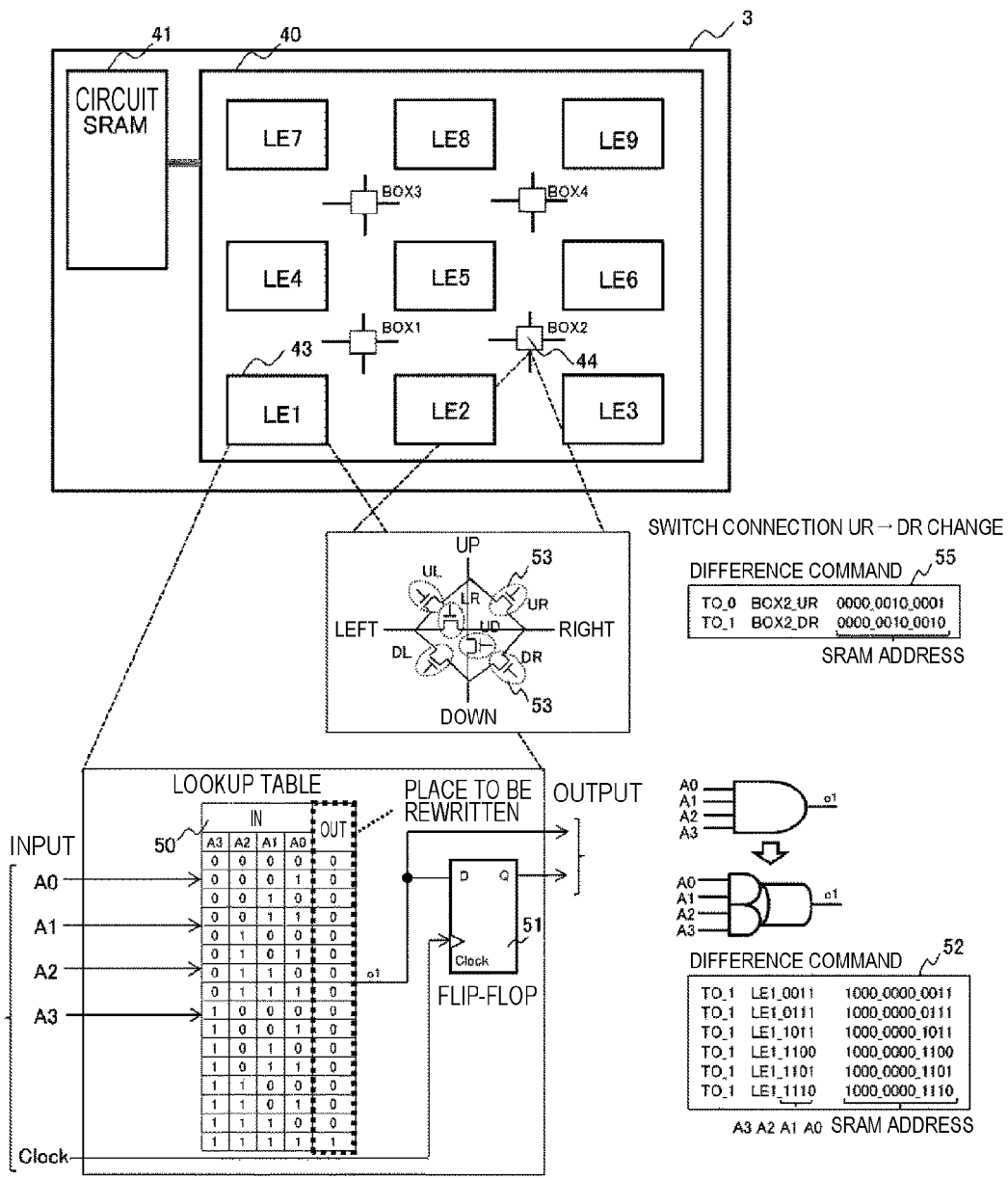
FIG. 6 is a diagram illustrating a configuration of a circuit unit and the difference command in the FPGA according to the first embodiment.

FIG. 6 is a diagram illustrating the configuration of the circuit unit and the difference command in the FPGA according to the first embodiment. FIG. 6 illustrates an example of (1) setting of the lookup table of the logic element 43 and (2) setting of the connection network of the switch box 44 to which the logic element 43 is connected, and a difference command relating thereto.

The circuit unit 40 of the FPGA 3 includes a plurality (nine in FIG. 6) of logic elements 43 and a plurality (four in FIG. 6) of switch boxes 44.

The logic element 43 includes a lookup table 50 and a flip-flop 51. The lookup table 50 is a table used for performing one output from four inputs, for example.

Here, a difference command in a case where the lookup table 50 of the logic element 43 of LE1 is changed from the 4-input AND (A0 & A1 & A2 & A3) to the 2-input AND-OR ((A0 & A1)|(A2 & A3)) will be described.

In this case, an output value in the lookup table 50 of the logic element 43 of LE1 is rewritten. The difference command 52 includes, for example, information for identifying the logic element 43 to be rewritten (here, LE1), values of four inputs A3, A2, A1, A0, and a change value of the output.

For example, TO_1 LE1_0011 indicates (TO_1) that the lookup table 50 of the logic element 43 of LE1 is changed to have an output value of "1" at the time of four inputs of A3=0, A2=0, A1=1, and A0=1.

As illustrated in FIG. 6, the switch box 44 includes, for example, switches 53 (UL, UR, DL, DR, LR, UD) in six directions.

In the switch box 44, in a case where the switch 53 (UR) in an upper right direction is changed to OFF, and the switch 53 (DR) in a lower right direction is changed to ON, the difference command 55 includes, for example, information for identifying the switch box 44 to be rewritten, information for identifying the target switch 53, and a set value of ON (1) or OFF (0). Specifically, "TO_0 BOX2_UR" in the difference command 55 indicates that the UR switch 53 of the switch box 44 in BOX2 is changed to OFF. "TO_1 BOX2_DR" indicates that the DR switch 53 of the switch box 44 of BOX2 is changed to ON.

The circuit SRAM 41 has an address for an area in which setting (configuration) of each circuit element such as all the logic elements 43 and the switch box 44 of the circuit unit 40 are stored. The circuit is changed by changing the address data of the circuit SRAM 41 that stores the setting of the circuit to be changed. Therefore, the difference command includes the address of the circuit SRAM 41 for designating the change location. The difference commands 52 and 55 indicate the address of the 12-bit circuit SRAM 41, as an example. An independent address is given to each element of the lookup table 50 and the individual switch 53 of the switch box 44.

Next, the data conversion unit 4 will be described in detail.

Figure 7:
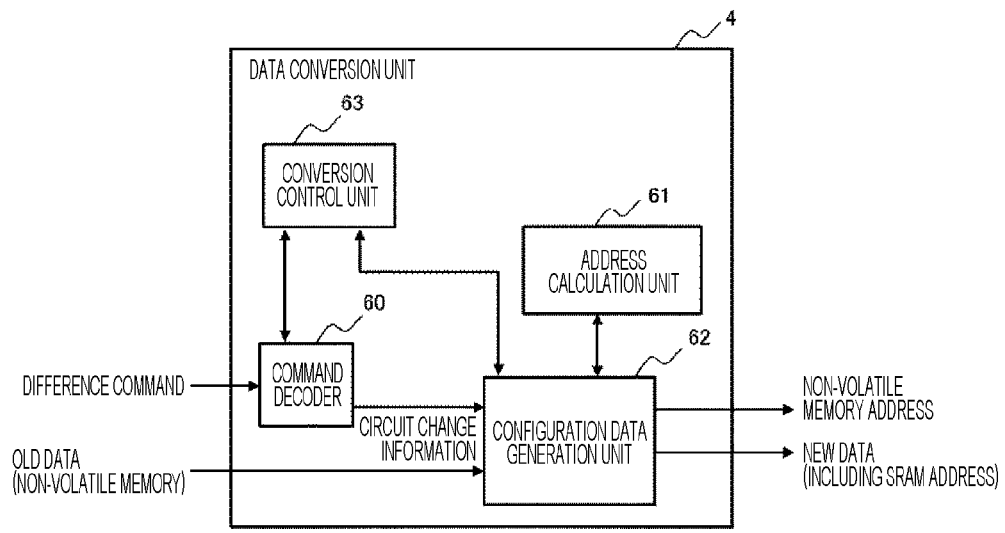
FIG. 7 is a functional configuration diagram of a data conversion unit according to the first embodiment.

FIG. 7 is a functional configuration diagram of the data conversion unit according to the first embodiment.

The data conversion unit 4 updates user data 8 in the configuration data in the non-volatile memory 6 to new data by using the user data (old data) in the old configuration data in the non-volatile memory 6 and the difference command received from the CGW 12 The difference command includes the address of the circuit SRAM 41 in FPGA circuit information of the change part and the corresponding data. Thus, the update from the old data to the new data is possible by rewriting the information of the circuit SRAM 41, which is included in the configuration data. Then, by using new configuration data, the new configuration data is read from the non-volatile memory 6 to the circuit SRAM 41 in the FPGA 3 when the FPGA 3 is activated. Thus, the configuration of the circuit unit 40 is newly determined.

More specifically, the data conversion unit 4 includes a command decoder 60, an address calculation unit 61, a configuration data generation unit 62, and a conversion control unit 63.

The conversion control unit 63 controls processing of the command decoder 60 and the configuration data generation unit 62.

The command decoder 60 decodes the difference command received from the CGW 12. The command decoder 60 outputs circuit change information to the configuration data generation unit 62. The circuit change information includes information for specifying a circuit element (logic element, switch box, and the like) to be changed in the circuit unit 40, and setting contents to be changed (output value of the lookup table, ON/OFF of the switch).

The address calculation unit 61 receives an input of the address of the circuit SRAM 41, which is included in the difference command, and calculates a non-volatile memory address corresponding to the setting information of the circuit element, which is included in the difference command of the old configuration data stored in the non-volatile memory 6.

The configuration data generation unit 62 outputs the non-volatile memory address to the non-volatile memory 6 to input setting information (old configuration data) before updating the corresponding circuit element. The setting information is stored in the area corresponding to the target address in the non-volatile memory 6. The configuration data generation unit 62 creates new data from the circuit change information of the difference command and the old configuration data, and outputs the target address and the new data to the non-volatile memory 6. The new data includes the address of the circuit SRAM 41 in which this data is to be stored. As a result, the non-volatile memory 6 updates the area corresponding to the target address to new data. The areas of the non-volatile memory 6 in which old data and new data are stored may be set to have different addresses.

According to the vehicle control system 10 according to the above-described embodiment, new data of user data based on a difference command is stored in the non-volatile memory 6. When the FPGA 3 is activated, new configuration data (vendor data 7 and user data 8 being the new data) stored in the non-volatile memory 6 is stored in the circuit SRAM 41. Thus, the circuit unit 40 of the FPGA 3 is set to have a circuit configuration in accordance with the new configuration data.

Accordingly, it is possible to perform solving of defects in FPGA3, function additions, function changes, and the like.

Next, a vehicle management system according to a second embodiment will be described.

In a vehicle control system 10 according to a second embodiment, the circuit unit 40 of the FPGA 3 is caused not to be destroyed even in a case where any power cutoff occurs during an update operation of configuration data in the non-volatile memory 6 in the vehicle control system according to the first embodiment. A part of the configuration of the ECU 1 is different from the vehicle control system according to the first embodiment. The same components to those in the vehicle control system according to the first embodiment are denoted by the same reference signs, and repetitive descriptions will be omitted.

The vehicle control system 10 according to the second embodiment checks (1) that a difference command arrives correctly at an ECU 1 and (2) that new configuration data is generated correctly with the difference command, in response to an occurrence of any power cutoff such as power cutoff by the ignition switch 15 or power cutoff by depletion of the battery 14. In a case where (1) and (2) are incorrect, the logic of the circuit unit 40 of the FPGA 3 is caused not to be destroyed.

Figure 8:
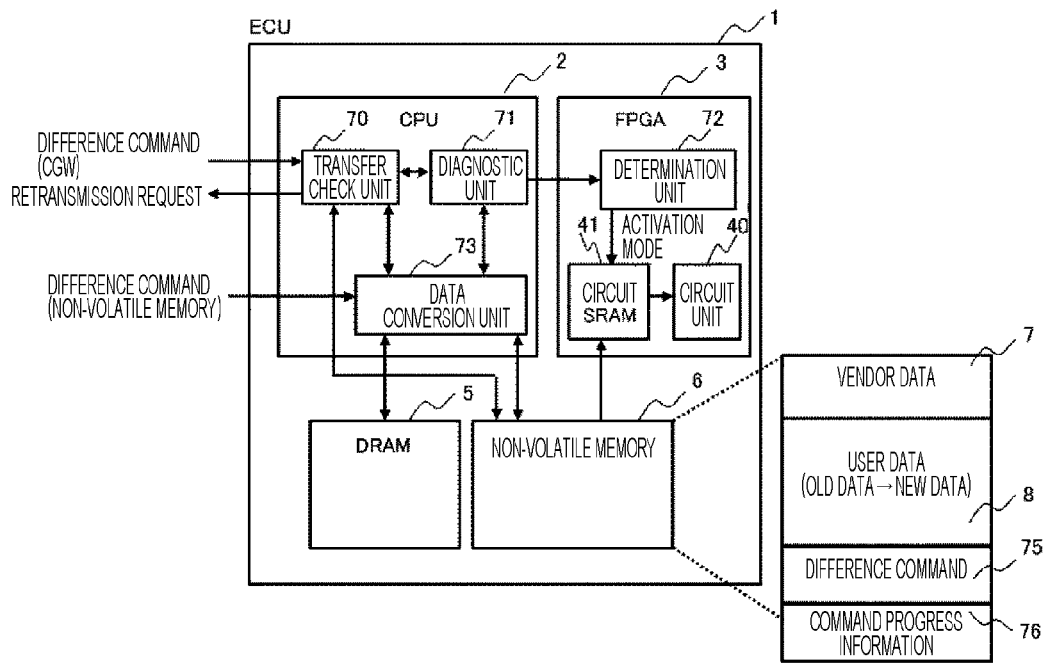
FIG. 8 is a configuration diagram of an ECU according to a second embodiment.

FIG. 8 is a configuration diagram of the ECU according to the second embodiment.

The ECU 1 includes a CPU 2, an FPGA 3, a DRAM 5, and a non-volatile memory 6.

The CPU 2 includes a transfer check unit 70, a diagnostic unit 71, and a data conversion unit 73. The FPGA 3 includes a determination unit 72 as an example of the reconfiguration control unit, a circuit SRAM 41, and a circuit unit 40. The non-volatile memory 6 stores vendor data 7, user data 8, a difference command 75, and command progress information 76. The user data 8 is old data in a case where an update by the difference command is not performed. The user data 8 is new data in a case where the update by the difference command is completed.

The transfer check unit 70 (1) checks and verifies whether or not the difference command has correctly arrived at the ECU 1 from the CGW 12. The CGW 12 checks and verifies whether or not the difference command has correctly arrived at the vehicle 100 from the data center 16. Verification of whether or not the difference command is correct can be realized by adding an error correction code such as chuck sum to the difference command and using the error correction code.

The difference command needs to arrive at the ECU 1 correctly. However, if the power is cut off immediately after the difference command arrives at the ECU 1, the difference command disappears. Thus, the transfer check unit 70 preserves the received difference command in the non-volatile memory 6. In the subsequent processing, the difference command preserved in the non-volatile memory 6 is used.

In the embodiment, the transfer check unit 70 performs two-step check as a check of the difference command corresponding to the power cutoff: (a) checks whether or not the difference command has correctly arrived at the ECU 1 from the CGW 12; and then (b) checks whether or not the difference command is correctly preserved in the non-volatile memory 6 in the ECU 1. Specifically, the transfer check unit 70 performs the check (a), stores the difference command checked to be correctly received, in the non-volatile memory 6, and then performs the check (b).

In a case where it is checked that the difference command has not arrived correctly at the ECU 1 from the CGW 12, the transfer check unit 70 performs a retransmission request for the difference command to the CGW 12. In addition, in a case where it is checked that the difference command is not correctly preserved in the non-volatile memory 6 in (b), this means that the ECU 1 does not hold the difference command. Thus, the transfer check unit 70 performs a retransmission request for the difference command to the CGW 12. The transfer check unit 70 notifies the data conversion unit 73 and the diagnostic unit 71 of the check results of (a) and (b).

In a case where the CGW 12 does not hold the difference command, the CGW 12 acquires the difference command from the data center 16 via the TCU 11.

In a case where it is not checked that the checks in (a) and (b) are normal, the data conversion unit 73 does not update the user data in the configuration data of the non-volatile memory 6. Therefore, even if the configuration data in the non-volatile memory 6 is read to the circuit SRAM 41, the configuration data is the data before the update. Thus, the logic of the circuit unit 40 of the FPGA 3 is not destroyed.

If it is checked in (b) that the difference command is normally stored in the ECU 1, the data conversion unit 73 updates the user data of the configuration data with the difference command held in the non-volatile memory 6.

The diagnostic unit 71 (2) checks whether the new configuration data is correctly generated in the non-volatile memory 6 with the difference command. Here, the end of the difference command is a special description allowing determination that the end is the end of the difference command.

Specifically, during update processing of the configuration data by the data conversion unit 73, the diagnostic unit 71 receives progress information (information indicating the location of the completed command among a plurality of commands in the difference command: refers to command progress information) of the difference command from the data conversion unit 73. The diagnostic unit 71 checks whether or not the update is performed up to the end of the difference command, based on whether or not the description indicating the end of the difference command is included in the command progress information. The command progress information is also used for specifying a location in the difference command, in which the subsequent update processing is resumed, in a case where the electric power is cut off during the update.

The data conversion unit 73 writes the command progress information in the non-volatile memory 6 simultaneously with the new data. In order to write the new data and the command progress information to the non-volatile memory 6 in an indivisible manner, it is necessary to be able to withstand the power cutoff during the execution time of the writing. Specifically, a capacitor or the like (not illustrated) that allows the power supply to continue just for a short time may be provided.

When the electric power is cut off in the process of generating the new configuration data with the difference command, and the new configuration data is not generated correctly, the following two operations are performed. One is that the diagnostic unit 71 instructs the determination unit 72 of the FPGA 3 to cause the FPGA 3 to perform a secure boot (a boot using only the vendor data 7). In a case where the determination unit 72 of the FPGA 3 receives the instruction of the secure boot, the determination unit actives the FPGA 3 by the secure boot, that is, transfers only the vendor data from the non-volatile memory to the circuit SRAM 41. The other is that, when the electric power is supplied the next time, the data conversion unit 73 uses the difference command 75 and command progress information to resume processing of updating the user data to the new data from a command next to the command of which the execution is completed among a plurality of commands in the difference command.

Thus, when the electric power is cut off in the process of generating the new configuration data with the difference command, and the new configuration data is not correctly generated, the diagnostic unit 71 notifies the determination unit 72 of the FPGA 3 of the secure boot as a boot mode of the FPGA 3. Thus, the FPGA 3 is activated by the secure boot, and the circuit unit 40 of the FPGA 3 does not perform a wrongful operation by logic destruction. After the electric power is restored, the data conversion unit 73 continuously updates the configuration data from a command part which has not been executed in the difference command. If the diagnostic unit 71 checks that the configuration data has been updated correctly, the diagnostic unit 71 notifies the determination unit 72 of the FPGA 3 of the boot mode using the updated user data 8. As a result, at the next activation of the FPGA 3, the determination unit 72 of the FPGA 3 transfers new configuration data including the vendor data and the updated user data to the circuit SRAM 41, and thus the circuit unit 40 is reconfigured.

Figure 9:
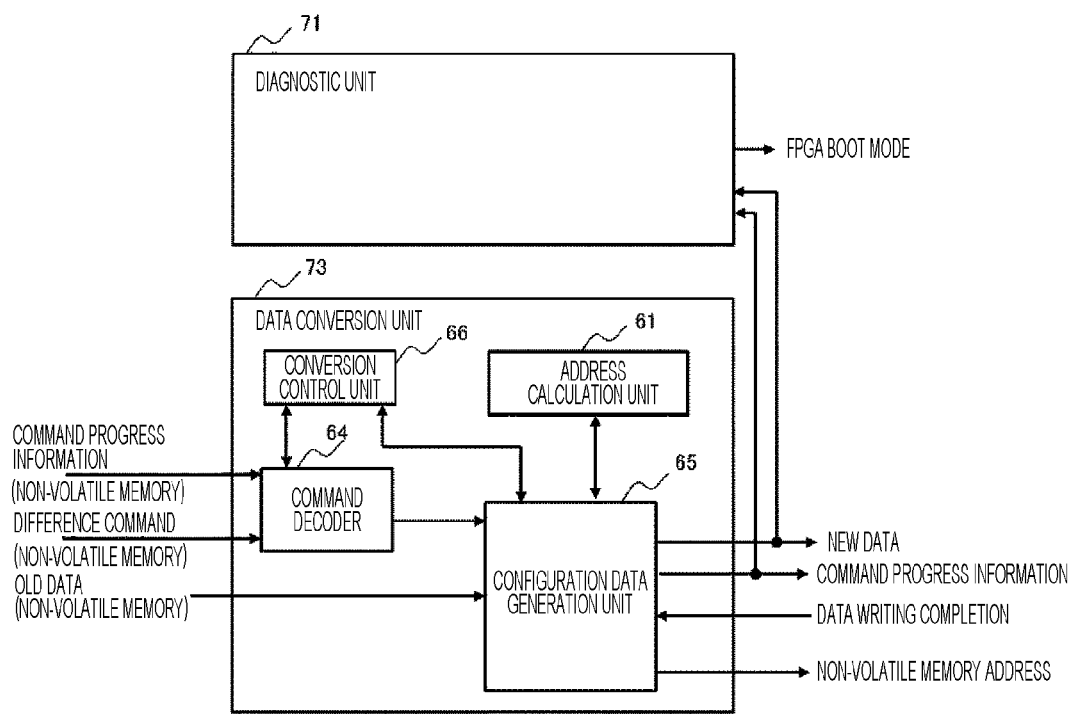
FIG. 9 is a functional configuration diagram of a diagnostic unit and a data conversion unit of the ECU according to the second embodiment.

FIG. 9 is a functional configuration diagram of the diagnostic unit and the data conversion unit of the ECU according to the second embodiment.

The data conversion unit 73 includes an address calculation unit 61, a command decoder 64, a configuration data generation unit 65, and a conversion control unit 66. The command decoder 64, the configuration data generation unit 65, and the conversion control unit 66 cause the command decoder 60, the configuration data generation unit 62, and the conversion control unit 63 in the first embodiment to further perform processing corresponding to power cutoff.

The diagnostic unit 71 receives the new data and the corresponding command progress information from the data conversion unit 73. The diagnostic unit 71 checks circuit information of the new data and determines whether or not the difference command is normally executed to the end thereof based on the command progress information. In a case where the difference command is not executed normally to the end, the diagnostic unit 71 outputs a signal indicating the secure boot mode to the determination unit 72 of the FPGA 3 as the FPGA 3 boot mode. In a case where the difference command is normally executed to the end, the diagnostic unit 71 outputs a signal indicating a boot mode using the user data to the determination unit 72 of the FPGA 3.

With such a configuration, the command decoder 64 of the data conversion unit 73 receives an input of old data and a difference command from the non-volatile memory 6, decodes the input command, and transfers the decoded command to the configuration data generation unit 65. At this time, since the difference command is configured with a plurality of command groups, the difference command is divided into predetermined blocks, and each divided block is transferred to the configuration data generation unit 65. The configuration data generation unit 65 generates new data for each block. At this time, the configuration data generation unit 65 generates command progress information which allows specifying of the used command part and indicates the progress of the command, and indivisibly outputs the generated new data, an address in the non-volatile memory 6, which corresponds to the new data, and the command progress information to the non-volatile memory 6, such that the last command part in the plurality of the command groups in the difference command, which has been used for generating the new data, is recognized. In a state where generation of the new data is started, only a part of the non-volatile memory 6 is updated, and power cutoff occurs before the update and preservation of the entirety of the new data are completed, after the electric power is restored, the configuration data generation unit 65 generates the new data from a part which has not been executed in the difference command, based on the command progress information preserved in the non-volatile memory 6, and preserves the generated new data in the non-volatile memory 6.

Next, FPGA update management processing in the ECU 1 according to the second embodiment will be described.

Figure 10:
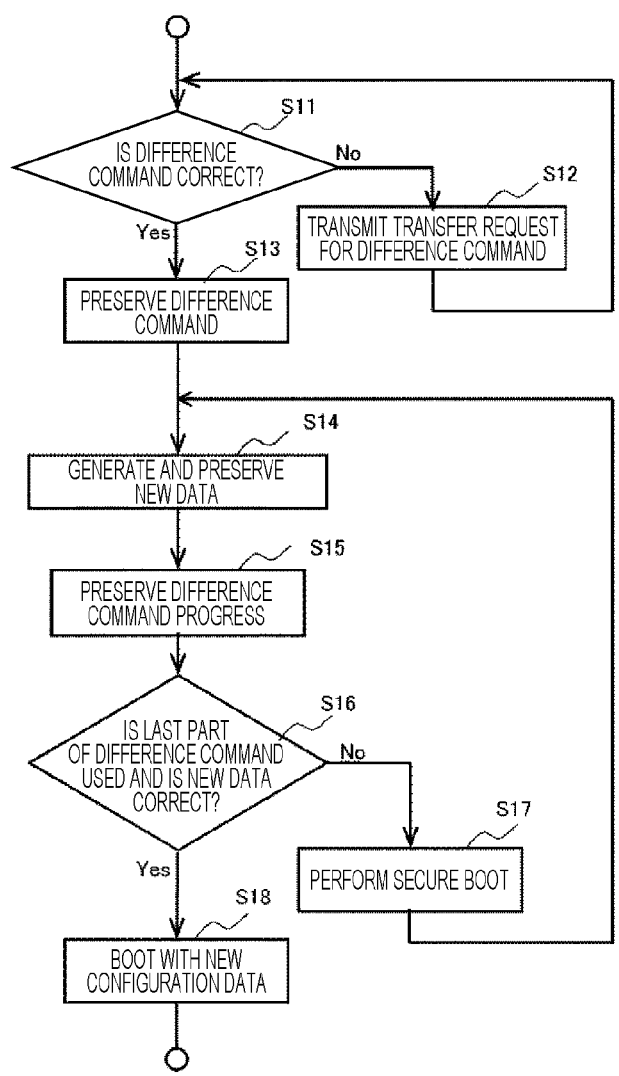
FIG. 10 is a flowchart of FPGA update management processing in the ECU according to the second embodiment.

FIG. 10 is a flowchart of FPGA update management processing in the ECU according to the second embodiment.

FPGA update management processing is performed, for example, in a case where the ECU 1 receives an update command from the CGW 12, or after the electric power for the ECU 1 is restored.

The transfer check unit 70 of the ECU 1 determines whether or not the difference command received from the CGW 12 is correct (Step S11). As a result, in a case where the difference command is not correct (Step S11: No), the transfer check unit 70 transmits a retransmission transfer request for the difference command to the CGW 12 (Step S12), and the process proceeds to Step S11. On the other hand, in a case where the difference command is correct (Step S11: Yes), the transfer check unit 70 preserves the difference command in the non-volatile memory 6 (Step S13).

Then, the data conversion unit 4 generates new data (updated user data) based on the difference command stored in the non-volatile memory 6 and the old data (user data before update). The data conversion unit 4 preserves the generated new data in the non-volatile memory 6 (Step S14) and preserves command progress information allowing specifying of the used command part in the difference command, in the non-volatile memory 6 (Step S15). In the embodiment, the data conversion unit 4 updates the old data in the non-volatile memory 6 when preserving the generated new data. Therefore, since the old data and the new data are not coexistingly preserved in the non-volatile memory 6, it is possible to reduce storage capacity required for the non-volatile memory 6.

Then, the diagnostic unit 71 determines whether or not the last part of the difference command is used, and the new data is correctly stored in the non-volatile memory 6, based on the command progress information output by the configuration data generation unit 65 (Step S16). As a result, in a case where the last part of the difference command is not used or in a case where the new data in the non-volatile memory 6 is not correct (Step S16: No), the diagnostic unit 71 notifies the determination unit 72 of the FPGA 3 to perform the secure boot. As a result, the determination unit 72 of the FPGA 3 performs the secure boot that activates the FPGA 3 using only the vendor data of the non-volatile memory 6 (Step S17), and the process proceeds to Step S14. With the processes subsequent to Step S14, update processing to new data by a not-used part in the difference command is performed.

On the other hand, in a case where the last part of the difference command is used, and the new data in the non-volatile memory 6 is correct (Step S16: Yes), the diagnostic unit 71 notifies the determination unit 72 of the FPGA 3 to perform a boot using the user data. As a result, the determination unit 72 of the FPGA 3 performs the boot for activating the FPGA 3 with new configuration data including the vendor data and the new data (updated user data) in the non-volatile memory 6 (Step S18).

According to this process, in a case where power cutoff occurs in the process of an update to new data by the difference command, in FPGA update management processing after the electric power is restored, it is determined, in Step S11, whether or not the difference command is correct. In a case where the difference command is not correct, the process of Step S12 is performed. If it is checked that the last part of the difference command has not been used, or the new data has not been correctly stored in the non-volatile memory 6, based on the command progress information output by the configuration data generation unit 65, in Step S16, the processes subsequent to Step S17 is performed, and new data corresponding to a part which has not been executed by power cutoff in the difference command is generated. As a result, new data corresponding to the difference command is stored in the non-volatile memory 6 without any trouble thereafter.

Next, a vehicle management system according to a third embodiment will be described.

A vehicle control system 10 according to a third embodiment is a system in which the functions of the data conversion unit 73 and the diagnostic unit 71 in the vehicle control system according to the first embodiment are executed by the FPGA 3. The same components to those in the vehicle control systems according to the first and second embodiments are denoted by the same reference signs, and repetitive descriptions will be omitted.

Figure 11:
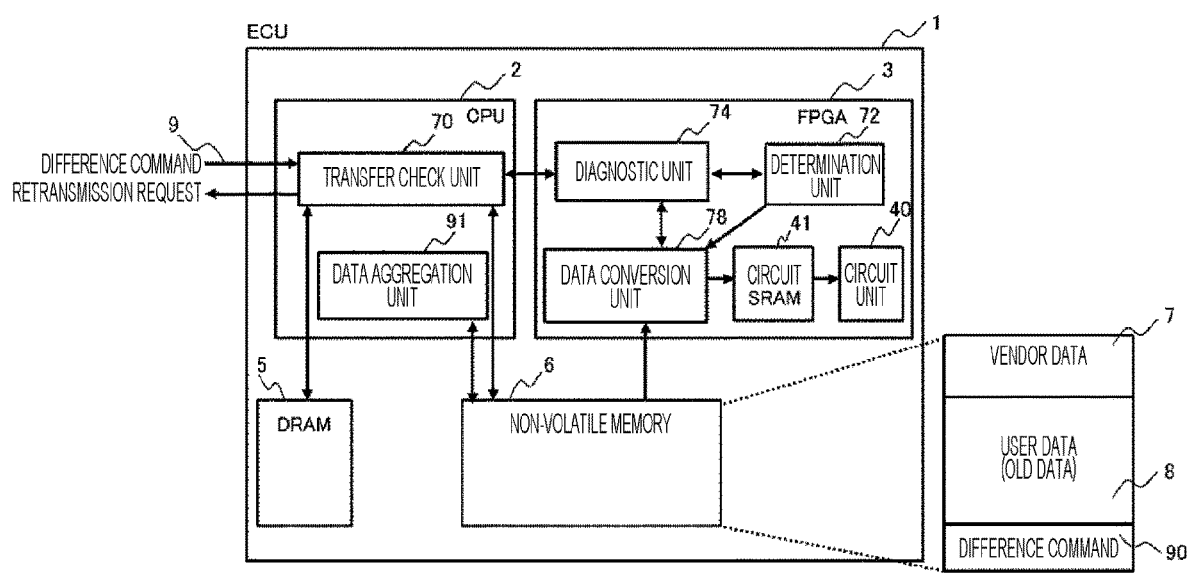
FIG. 11 is a configuration diagram of an ECU according to a third embodiment.

FIG. 11 is a configuration diagram of an ECU according to the third embodiment.

In an ECU 1 according to the third embodiment, vendor data 7, user data (old data) 8 before an update, and a difference command 90 are stored in the non-volatile memory 6, but the updated user data (new data) is not stored in the non-volatile memory 6.

The CPU 2 further includes a data aggregation unit 91 as an example of a latest configuration information generation unit. The data aggregation unit 91 has the same function as the data conversion unit 4.

The transfer check unit 70 in the CPU checks whether or not difference command has been correctly received from the CGW 12 and whether or not the difference command has been correctly stored in the non-volatile memory 6. The transfer check unit 70 notifies the diagnostic unit 74 of the FPGA 3 of the check results.

The FPGA 3 further includes a diagnostic unit 74 and a data conversion unit 78. The data conversion unit 78 is disposed between the non-volatile memory 6 and the circuit SRAM 41. The data conversion unit 78 acquires configuration data (vendor data and user data (old data)) from the non-volatile memory 6. In a case where there is no difference command in the non-volatile memory 6, the data conversion unit 78 stores the acquired configuration data in the circuit SRAM 41. In a case where there is a difference command in the non-volatile memory 6, the data conversion unit 78 generates new data of the user data with the configuration data and the difference command extracted from the non-volatile memory 6, and stores new configuration data including the vendor data and the new data in the circuit SRAM 41.

In a case where the diagnostic unit 74 receives a notification that the difference command is not correctly written in the non-volatile memory 6, from the transfer check unit 70, the diagnostic unit 74 notifies the determination unit 72 to set a boot (secure boot) in which old configuration data (vendor data and old data) is stored as it is in the circuit SRAM 41 without using difference command of the non-volatile memory 6. In a case where the diagnostic unit 74 receives a notification that the difference command is correctly written in the non-volatile memory 6, the diagnostic unit 74 generates new data with the difference command in the non-volatile memory 6 and the old data. Then, the diagnostic unit 74 notifies the determination unit 72 to set a boot in which new configuration data (vendor data and new data) is stored in the circuit SRAM 41.

The determination unit 72 controls the data conversion unit 78 to perform a boot in accordance with the notification from the diagnostic unit 74. That is, in a case where the difference command is not correctly stored in the non-volatile memory 6, the determination unit 72 receives an instruction not to use the difference command, from the diagnostic unit 74. Thus, when the FPGA 3 is activated, old configuration data can be stored in the circuit SRAM 41. Therefore, the logic of the circuit unit 40 of the FPGA 3 is not destroyed.

The vehicle management system according to the third embodiment has an effect that it is possible to simplify the response to power cutoff in comparison to the vehicle management system according to the second embodiment. That is, in the second embodiment, it is necessary that the user data of the non-volatile memory 6 is rewritten to new data. In order to allow an update of configuration data to continue after electric power is restored after power cutoff occurs at a certain timing, a configuration of storing command progress information of the difference command in the non-volatile memory 6 is required, and a configuration of causing an update of the configuration data and the command progress information to the non-volatile memory 6 to be indivisible is required. On the other hand, in the third embodiment, in the user data of the non-volatile memory 6, the old data is left as it is without being updated. When configuration data is stored in the circuit SRAM 41, new data is generated based on the difference command and the old data. Thus, as a response after the electric power is cut off, it may be determined whether or not the difference command is correctly stored in the non-volatile memory 6. In a case where the difference command is not correctly stored, the difference command may be caused to be correctly stored in the non-volatile memory 6.

The diagnostic unit 74 checks whether or not power cutoff occurs during a period in which the configuration data is transferred from the non-volatile memory 6 to the circuit SRAM 41. During the secure boot, the diagnostic unit 74 checks whether the vendor data at the end has been correctly stored in the circuit SRAM 41. During a normal boot, the diagnostic unit 74 checks whether or not the difference command at the end has been converted and stored in the circuit SRAM 41. After the electric power is supplied, when the diagnostic unit 74 determines that power cutoff occurs during the transfer to the circuit SRAM 41, the diagnostic unit 74 instructs the determination unit 72 to boot again.

Upon receiving the instruction, the determination unit 72 transfers the configuration data to the circuit SRAM 41 from the beginning, and controls the data conversion unit 78.

In the third embodiment, for example, in a case where the difference command is received a plurality of times by OTA, that is, in a case where the user data is updated a plurality of times, the difference command of each time is accumulated and stored in the non-volatile memory 6. In a case where the difference command is stored a plurality of times in the non-volatile memory 6 as described above, the data conversion unit 78 executes all the difference commands of each time to generate the latest user data, when the FPGA 3 is activated Therefore, if the number of difference commands is too large, there is a problem that the activation time of the FPGA 3 is prolonged.

Thus, in this embodiment, difference command reflection processing of generating the latest user data reflecting the plural number of times of updates, based on the user data before the update and the subsequent plurality of difference commands is performed.

Figure 12:
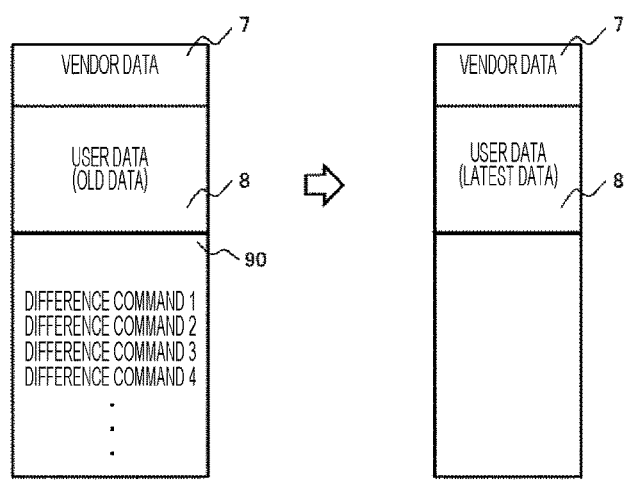
FIG. 12 is a diagram illustrating difference command reflection processing according to the third embodiment.

FIG. 12 is a diagram illustrating difference command reflection processing according to the third embodiment.

Difference command reflection processing is performed, for example, for each predetermined time, in a case where the number of difference commands exceeds a predetermined number, or in a case where the volume of the plurality of difference commands exceeds a predetermined volume. It is assumed that the difference command reflection processing is performed under the condition that the power supply to the ECU 1 is reliably secured (for example, in a case where the vehicle 100 is in a state where the power is secured at the vehicle dealer, or in a case where the driver maintains the ignition switch to be ON).

As illustrated in the left diagram of FIG. 12, in the non-volatile memory 6, in a case where difference commands (difference commands 1, 2, 3, 4, . . . ) corresponding to plural number of times of updates are stored, the data aggregation unit 91 generates new user data based on the user data (old data) and the difference command in the update immediately thereafter. Then, the data aggregation unit 91 generates the latest user data by repeating processing of updating the user data with the difference command corresponding to the update of each time, in a manner of generating new user data based on the generated user data and the difference command in the update in the next order. As illustrated in the right diagram in FIG. 12, the data aggregation unit 91 stores the latest user data in the non-volatile memory 6 and deletes the difference command used for the update, from the non-volatile memory 6.

If the difference command reflection processing is performed, it is not necessary to perform the update processing with the difference command unless a new difference command is received when the FPGA 3 is subsequently activated. Thus, it is possible to speed up the activation. In addition, since the difference command stored so far can be deleted from the non-volatile memory 6, it is possible to appropriately secure an area for storing subsequent difference commands, and to reduce the capacity required for the non-volatile memory 6.

The present invention is not limited to the above-described embodiments, and can be appropriately modified and implemented in a range without departing from the gist of the present invention.

For example, in the above-described embodiments, an example in which the difference command is received by OTA has been described. However, the present invention is not limited thereto, and the difference command may be received via a wired line. Further, the difference command may be stored in a storage medium (DVD, CD, flash memory, and the like) connectable to the vehicle control system 10 and be received from the storage medium.

In the above embodiments, an example in which only user data in configuration data is updated with a difference command has been described. However, the present invention is not limited thereto, and the vendor data may be updated with the difference command.

In the above embodiments, the electronic control system mounted in the vehicle has been described as an example. However, the present invention is not limited thereto, and the present invention can be applied to an electronic control system which is not mounted in the vehicle.

REFERENCE SIGNS LIST

1 ECU
2 CPU
3 FPGA
4 data conversion device unit
5 DRAM
6 non-volatile memory
10 vehicle control system
16 data center
40 reconfigurable circuit unit
41 circuit SRAM
100 vehicle
1000 vehicle management system

The invention claimed is:

1. An electronic control system comprising:
a reconfigurable circuit device including a circuit unit including a reconfigurable circuit and a setting storage that stores configuration information of the circuit unit;
a communicator configured to acquire difference information regarding a change part of a circuit element in the circuit unit;
a data convertor configured to update the configuration information based on the difference information;
a non-volatile storage that stores the configuration information stored in the setting storage,
wherein the data convertor is configured to update the configuration information stored in the non-volatile storage based on the difference information acquired by the communicator;
wherein the communicator is configured to store the acquired difference information in the non-volatile storage,
a diagnostic circuit configured to diagnose whether or not all pieces of the setting information in the difference information is reflected in the configuration information of the non-volatile storage;
a reconfiguration controller that stores only predetermined configuration information that does not cause an abnormal operation among pieces of the configuration information stored in the non-volatile storage, in the setting storage in a case where all the pieces of the setting information in the difference information is not reflected in the configuration information of the non-volatile storage during circuit reconfiguration of the circuit unit in the reconfigurable circuit device; and
a transfer check circuit configured to perform a check of the difference information corresponding to power cut-off, the check including a first step of checking whether the difference information has correctly arrived and a second step of checking whether the difference information is correctly preserved in the non-volatile storage,
wherein the transfer check circuit is configured to, when the transfer check circuit has determined that the difference information has not correctly arrived, issue a retransmission request,
wherein the diagnostic circuit is configured to activate a secure boot after power cut off, and
wherein the diagnostic circuit is configured to, when a difference information is determined to not be executed properly, to cause a secure boot to be activated.

2. The electronic control system according to claim 1, wherein the difference information is a command including information for identifying the circuit element in the circuit unit and setting information for the circuit element.

3. The electronic control system according to claim 1, wherein the data convertor includes
an address calculator configured to calculate an address of the non-volatile storage in which setting information of the circuit element is stored, based on identification information of the circuit element, and
a setting information storage that stores the setting information of the circuit element in an area corresponding to the address in the non-volatile storage.

4. The electronic control system according to claim 1, wherein the communicator is configured to receive the difference information in radio.

5. An electronic control system comprising:
a reconfigurable circuit device including a circuit unit including a reconfigurable circuit and a setting storage that stores configuration information of the circuit unit;
a communicator configured to acquire difference information regarding a change part of a circuit element in the circuit unit;
a data convertor configured to update the configuration information based on the difference information;
a non-volatile storage that stores the configuration information stored in the setting storage,
wherein the data convertor is configured to update the configuration information stored in the non-volatile storage based on the difference information acquired by the communicator;
a diagnostic circuit configured to diagnose whether or not all pieces of the setting information in the difference information are reflected in the configuration information of the non-volatile storage,
wherein the communicator stores the acquired difference information in the non-volatile storage, and
the data convertor is configured to reflect progress information of the difference information, which has not been reflected, in the configuration information of the non-volatile storage in a case where the diagnostic circuit diagnoses that all the pieces of the setting information in the difference information are not reflected in the configuration information of the non-volatile storage; and
a transfer check circuit configured to perform a check of the difference information corresponding to power cut-off, the check including a first step of checking whether the difference information has correctly arrived and a second step of checking whether the difference information is correctly preserved in the non-volatile storage,
wherein the transfer check circuit is configured to, when the transfer check circuit has determined that the difference information has not correctly arrived, issue a retransmission request,
wherein the diagnostic circuit is configured to activate a secure boot after power cut off, and
wherein the diagnostic circuit is configured to, when a difference information is determined to not be executed properly, to cause a secure boot to be activated.

6. An electronic control system comprising:
a reconfigurable circuit device including a circuit unit including a reconfigurable circuit;
a setting storage configured to store configuration information of the circuit unit,
a communicator configured to acquire difference information regarding a change part of a circuit element in the circuit unit;
a diagnostic circuit, and
a data convertor configured to update the configuration information based on the difference information;
wherein the communicator is configured to store the acquired difference information in a non-volatile storage, and
the data convertor is configured to acquire the configuration information and the difference information from the non-volatile storage, update the configuration information based on the difference information, and store the updated configuration information in the setting storage, during circuit configuration of the circuit unit;

wherein the diagnostic circuit is configured to diagnose whether or not all pieces of the difference information are stored in the non-volatile storage, and in a case where it is diagnosed that all the pieces of the difference information are not stored in the non-volatile storage, the data convertor stores the configuration information of the non-volatile storage in the setting storage; and a transfer check circuit configured to perform a check of the difference information corresponding to power cut-off, the check including a first step of checking whether the difference information has correctly arrived and a second step of checking whether the difference information is correctly preserved in the non-volatile storage, wherein the transfer check circuit is configured to, when the transfer check circuit has determined that the difference information has not correctly arrived, issue a retransmission request, wherein the diagnostic circuit is configured to activate a secure boot after power cut off, and wherein the diagnostic circuit is configured to, when a difference information is determined to not be executed properly, to cause a secure boot to be activated.

\* \* \* \* \*